United States Patent [19]
Burrows et al.

[11] Patent Number: 5,981,306
[45] Date of Patent: Nov. 9, 1999

[54] METHOD FOR DEPOSITING INDIUM TIN OXIDE LAYERS IN ORGANIC LIGHT EMITTING DEVICES

[75] Inventors: Paul Burrows, Princeton Junction; Stephen R. Forrest, Princeton; Zilan Shen, Lawrenceville, all of N.J.

[73] Assignee: The Trustees of Princeton University, Princeton, N.J.

[21] Appl. No.: 08/928,800

[22] Filed: Sep. 12, 1997

[51] Int. Cl.$^6$ .................................................... H01L 51/40
[52] U.S. Cl. ............................... 438/22; 438/99; 257/40; 313/506
[58] Field of Search ........................ 438/22, 99; 257/40; 313/506

[56] References Cited

U.S. PATENT DOCUMENTS 4,950,950  8/1990  Perry et al. .
5,703,436  12/1997  Forrest et al. .

FOREIGN PATENT DOCUMENTS

96/19792  6/1996  WIPO .

OTHER PUBLICATIONS

C.W. Tang et al, "Organic electroluminescent diodes," Appl. Phys. Lett. 51 (12), Sep. 21, 1987.
S.R. Forrest te al., "Organic emitters promise a new generation of displays," Laser Focus World, Feb. 1995.
D.R. Baigent et al., "Conjugated polymer light–emitting diodes on silicon substrates," Appl. Phys. Lett. 65(21), Nov. 21, 1994.
H.H. Kim et al., "Silicon Compatible Organic Light Emitting Diode," Journal of Lightwave Technology, vol. 12, No. 12, Dec. 1994.
V. Bulovic et al., "Transparent light–emitting devices," Nature, vol. 380, Mar. 7, 1996.
G. Gu et al., "Transparent organic light emitting devices," Appl. Phys. Lett. 68(19), May 6, 1996.

Primary Examiner—Charles Bowers
Assistant Examiner—Keith Christianson
Attorney, Agent, or Firm—Kenyon & Kenyon

[57] ABSTRACT

A method is disclosed for fabricating organic light emitting devices (OLEDS) containing an indium tin oxide (ITO) layer that is deposited onto a fragile layer. The ITO layer is fabricated using a low, non-damaging, ITO deposition rate until a protective ITO layer is formed, at which point the ITO deposition rate is increased to a substantially higher deposition rate without causing damage to the underlying layers. OLEDs fabricated using the accelerated ITO deposition rate could be made with I–V characteristics having no practically discernible difference from the I–V characteristics of an OLED in which the ITO deposition rate was kept at a low deposition rate throughout the ITO deposition process.

5 Claims, 4 Drawing Sheets

METHOD FOR DEPOSITING INDIUM TIN OXIDE LAYERS IN ORGANIC LIGHT EMITTING DEVICES

FIELD OF THE INVENTION

This invention relates to organic light emitting devices (OLEDs) and more particularly to an improved method of depositing the indium tin oxide (ITO) layers that are used in such devices.

BACKGROUND OF THE INVENTION

Organic light emitting devices (OLEDs) are comprised of several organic layers in which one of the layers is comprised of an organic material that can be made to electroluminesce by applying a voltage across the device, C. W. Tang et al., *Appl. Phys. Lett* 51, 913 (1987). Certain OLEDs have been shown to have sufficient brightness, range of color and operating lifetimes for use as a practical alternative technology to LCD-based full color flat-panel displays (S. R. Forrest, P. E. Burrows and M. E. Thompson, Laser Focus World, February 1995). Since many of the thin organic films used in such devices are transparent in the visible spectral region, they allow for the realization of a completely new type of display pixel in which red (R), green (G), and blue (B) emitting OLEDs are placed in a vertically stacked geometry to provide a simple fabrication process, a small R-G-B pixel size, and a large fill factor.

A transparent OLED (TOLED), which represents a significant step toward realizing high resolution, independently addressable stacked R-G-B pixels, was reported in International Patent Application No. PCT/US95/15790. This TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg—Ag—ITO electrode layer for electron-injection. A device was disclosed in which the ITO side of the Mg—Ag—ITO electrode layer was used as a hole-injecting contact for a second, different color-emitting OLED stacked on top of the TOLED. Each layer in the stacked OLED (SOLED) was independently addressable and emitted its own characteristic color. This colored emission could be transmitted through the adjacently stacked transparent, independently addressable, organic layer, the transparent contacts and the glass substrate, thus allowing the device to emit any color that could be produced by varying the relative output of the red and blue color-emitting layers.

The PCT/US95/15790 application disclosed an integrated OLED for which both intensity and color could be independently varied and controlled with external power supplies in a color tunable display device. The PCT/US95/15790 application, thus, illustrates a principle for achieving integrated, full color pixels that provide high image resolution, which is made possible by the compact pixel size. Furthermore, relatively low cost fabrication techniques, as compared with prior art methods, may be utilized for making such devices.

Such devices whose structure is based upon the use of layers of organic optoelectronic materials generally rely on a common mechanism leading to optical emission. Typically, this mechanism is based upon the radiative recombination of injected charge. Specifically, OLEDs are comprised of at least two thin organic layers separating the anode and cathode of the device. The material of one of these layers is specifically chosen based on the material's ability to transport holes (a "hole transporting layer") and the material for the other layer is specifically selected according to its ability to transport electrons (an "electron transporting layer"). With such a construction, the device can be viewed as a diode with a forward bias when the potential applied to the anode is higher than the potential applied to the cathode. Under these bias conditions, the anode injects holes (positive charge carriers) into the hole transporting layer, while the cathode injects electrons into the electron transporting layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. Recombination of this short-lived state may be visualized as an electron dropping from its conduction potential to a valence band, with relaxation occurring, under certain conditions, preferentially via a photoemissive mechanism. Under this view of the mechanism of operation of typical thin-layer organic devices, the electroluminescent layer comprises a luminescence zone receiving mobile charge carriers (electrons and holes) from each electrode.

The materials that function as the electron transporting layer of the OLED are frequently the same materials that are incorporated into the OLED to produce the electroluminescent emission. Such devices are referred to as having a single heterostructure. Alternatively, the electroluminescent material may be present in a separate emissive layer between the hole transporting layer and the electron transporting layer in what is referred to as a double heterostructure.

In order to be useful in practical, low cost, active matrix displays, OLED device structures that are integratable with pixel electronics are required. A conventional OLED is grown on a transparent anode such as ITO, and the emitted light is viewed through the substrate, complicating integration with electronic components such as silicon-based display drivers. It is therefore desirable to develop an OLED with emission through a top, transparent contact.

A surface-emitting polymer-based OLED grown on silicon with a transparent ITO and a semitransparent Au or Al top anode has been demonstrated, D. R. Baigent, et al., *Appl. Phys. Lett.* 65, 2636 (1994); H. H. Kim, et al., *J. Lightwave Technol.* 12, 2107 (1994). A similar integration of molecular OLEDs with silicon was achieved using a tunneling $SiO_2$ interface, Kim et al. The tunneling interface, however, increases the device operating voltage, and can be avoided in structures such as for the recently reported transparent TOLEDs, V. Bulovic, et al., *Nature* 380, 29 (1996) and G. Gu, et al., *Appl. Phys. Lett.* 68, 2606 (1996), which can, in principle, be grown on a silicon substrate. The TOLED anode, however, forms the electrode contact which is in direct contact with the substrate, "the bottom contact", whereas for display drivers employing n-channel field effect transistors (NFETs), such as amorphous silicon NFETs, it is desirable for the bottom contact of the OLED to be the cathode. This requires fabricating inverted OLEDs (IOLEDs), that is, devices in which the order of placing the sequence of layers onto the substrate is reversed. In particular, for a single heterostructure IOLED, the electron-injecting cathode layer is deposited onto the substrate, the electron transporting layer is deposited onto the cathode, the hole transporting layer is deposited onto the electron transporting layer and the hole-injecting ITO anode layer is deposited onto the hole transporting layer.

Fabrication of such IOLEDs, or TOLEDs, thus requires that the ITO anode layer be sputter-deposited directly or indirectly onto relatively fragile organic thin films. Since the ITO layer is typically deposited using conventional sputtering or electron beam methods so as to produce layers having a thickness from about 500 Å (angstroms) up to as much as 4000 Å, it is desirable that these layers be deposited at the highest deposition rates possible so as to reduce the time necessary to prepare such layers. Unfortunately, it has been found that while the ITO layer may be deposited at a rate of up to 50–100 Å per minute, or more, whenever the ITO layer is deposited on a bare substrate, the deposition rate may be only about 2–5 Å/minute, if the ITO is deposited directly onto an organic layer or onto a Mg:Ag surface, which is itself typically deposited over several organic layers. Since the organic layers are highly vulnerable to damage when subjected to the beam of high energy particles that are used at the higher ITO deposition rates, higher deposition rates can cause substantial damage to the underlying organic layers, thus causing unacceptably large deterioration in the overall performance of the OLED.

Whenever the ITO layer of an OLED is deposited onto such fragile organic surfaces, it would be desirable if the ITO layer could be deposited at substantially higher deposition rates than have been possible until now.

ADVANTAGES AND SUMMARY OF THE INVENTION

The present invention is directed toward an improved method of preparing the ITO layer of an OLED wherein, during the course of preparing the ITO layer, the deposition rate is increased from a relatively low initial deposition rate to a substantially higher deposition rate after the depositing ITO layer has reached a sufficient thickness such that damage to the underlying layers is prevented.

More specifically, the present invention is directed to a vacuum deposition process in which the initial deposition rate is increased by a factor of least about five- to ten-fold after a layer thickness of about 50 Å to about 200 Å is reached.

Still more specifically, the present invention is directed to a process in which the initial deposition rate is about 2–5 Å/minute and the final deposition rate is at least about 50–60 Å/minute.

One of the advantages of the present method is that it substantially reduces the time required to prepare the ITO layer, for example, from about 4–5 hours, or more, down to 1–2 hours, or less, while still retaining the overall performance that is required of the OLED in which the ITO layer is incorporated.

In summary, the subject invention is directed to a method of fabricating an organic light emitting device comprising:
   fabricating a heterostructure for producing electroluminescence wherein the fabrication process includes the steps of:
      (a) depositing indium tin oxide at a low deposition rate to form a protective indium tin oxide layer; and then
      (b) depositing indium tin oxide at a substantially higher deposition rate.

Further objectives and advantages of the subject invention will be apparent to those skilled in the art from the detailed description of the invention.

DETAILED DESCRIPTION OF THE PREFERRED EMBODIMENTS

The present invention will now be described in detail for specific preferred embodiments of the invention, it being understood that these embodiments are intended only as illustrative examples and the invention is not to be limited thereto.

The OLEDs of the present invention are comprised of an ITO-layer-containing heterostructure for producing electroluminescence which may be fabricated as a single heterostructure or as a double heterostructure. The materials, methods and apparatus for preparing single and double heterostructures are disclosed, for example, in U.S. Pat. No. 5,554,220, which is incorporated herein in its entirety by reference. In particular, the present invention is directed toward OLEDs which include an ITO-layer-containing heterostructure for producing electroluminescence wherein, whenever the ITO is deposited on a fragile surface that is vulnerable to damage that can be caused by typical ITO deposition rates, the ITO layer is initially deposited at a low deposition rate and is then deposited at a substantially higher deposition rate as soon as the ITO layer reaches a thickness sufficient to protect the underlying layers.

Figure 1:
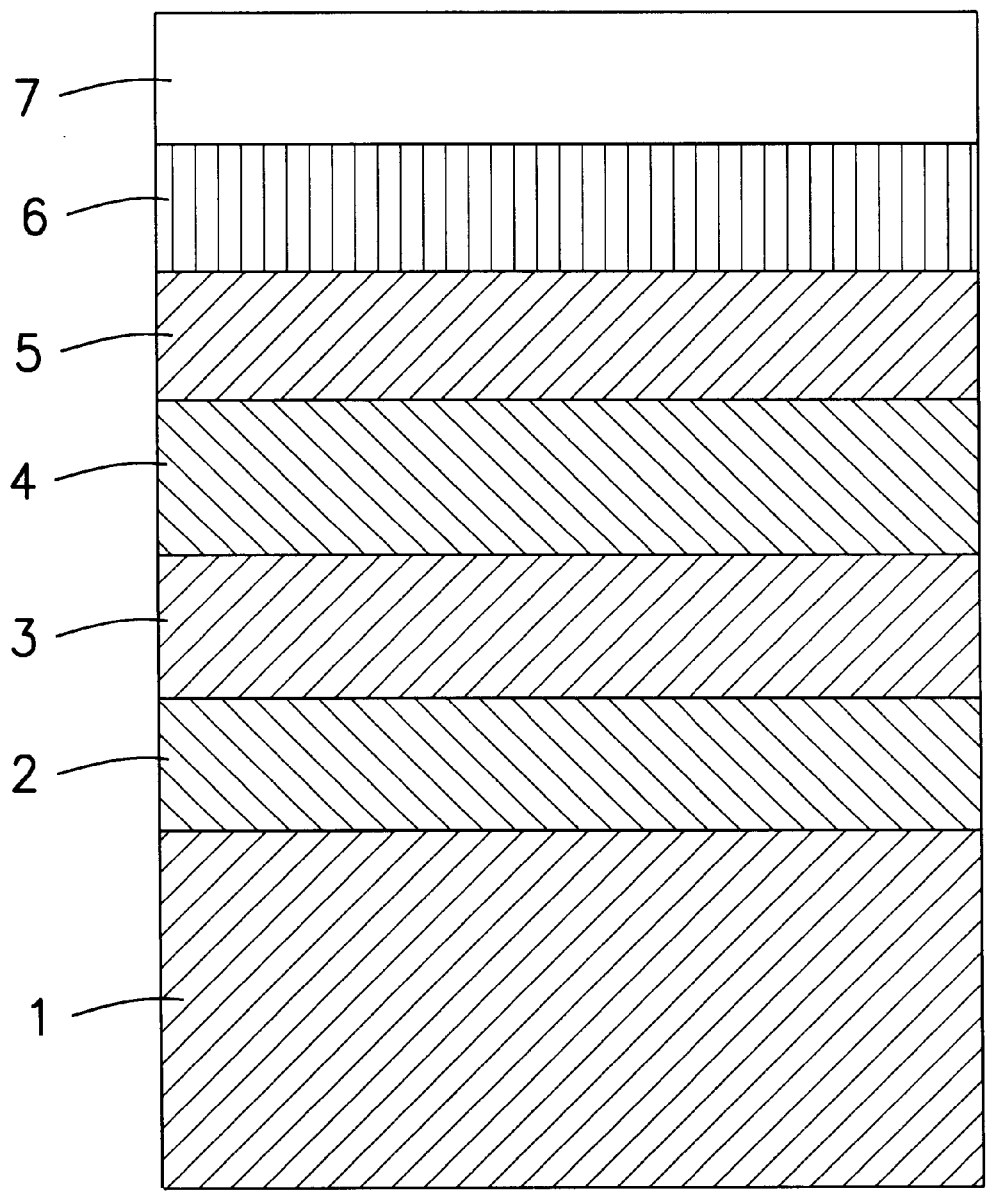
FIG. 1 shows a cross section of an OLED containing an ITO layer prepared in two stages, the first stage being prepared using a low ITO deposition rate and the second stage being prepared using a substantially higher ITO deposition rate.

As used herein, the term "heterostructure for producing electroluminescence" refers to a heterostructure that includes, for a single heterostructure such as shown in FIG. 1, a substrate 1, a hole injecting anode layer 2 in contact with the substrate, a hole transporting layer 3 in contact with the anode layer, a thin electron transporting layer 4 in contact with the hole transporting layer, an electrode injecting cathode layer 5 in contact with the hole electron transporting layer, a relatively thin protective ITO layer 6 that is deposited at a low ITO deposition rate onto the cathode layer and a much thicker ITO layer 7 that is then deposited at a much higher ITO deposition rate onto the thin protective ITO layer. A hole injection enhancement layer may be present between the ITO layer and the hole transporting layer.

Alternatively, if a double heterostructure is used to produce electroluminescence, a separate emissive layer (not shown in FIG. 1) is included between the hole transporting layer and the electron transporting layer. If the heterostructure for producing electroluminescence is included as part of a stacked OLED, one or both of the electrodes of an individual heterostructure may be in contact with an electrode of an adjacent heterostructure.

Materials that may be used as the substrate include, in particular, glass, transparent polymer such as polyester, sapphire or quartz.

Materials that may be used as the hole-injecting anode layer include, in particular, ITO, Zn—In—$SnO_2$ or $SbO_2$.

Materials that may be used as the hole transporting layer include, in particular, N,N'-diphenyl-N,N'-bis(3-methylpheny)1-1'biphenyl-4,4'diamine (TPD), 4,4'-bis[N-(1-napthyl)-N-phenyl-amino]biphenyl ($\alpha$-NPD) or 4,4'-bis[N-(2-napthyl)-N-phenyl-amino]biphenyl ($\beta$-NPD).

Materials that may be used as the electron transporting layer include, in particular, tris-(8-hydroxyquinoline)-aluminum (Al$q_3$) and carbazole.

Materials that may be used as the electron-injecting, metal cathode layer include, in particular, Mg—Ag, Li—Ag or Ca.

Materials that may be used as the separate emissive layer, if present, include, in particular, dye-doped Al$q_3$.

Materials that may be used as the hole injection enhancement layer include 3,4,9,10-perylenetetra-carboxylic dianhydride (PTCDA) or copper phthalocyanine (CuPc). Such materials may also serve as protective layers for protecting the underlying organic layers.

The OLEDs of the present invention have the advantage that they can be fabricated entirely from vacuum-deposited molecular organic materials as distinct, for example, from OLEDs in which some of the layers are comprised of polymeric materials, which cannot be readily deposited using vacuum deposition techniques. A vacuum-deposited material is one which can be deposited in a vacuum typically having a background pressure less than one atmosphere, preferably about $10^{-5}$ to about $10^{-11}$ Torr for vacuum deposition, or about 50 Torr to about $10^{-5}$ Torr for vapor deposition.

The single or double heterostructures as referred to herein are intended solely as examples for showing how an OLED embodying the present invention may be fabricated without in any way intending the invention to be limited to the particular materials or sequence for making the layers shown. For example, a single heterostructure typically includes a substrate which may be opaque or transparent, rigid or flexible, and/or plastic, metal or glass; a first electrode, which is typically a high work function, hole-injecting anode layer, for example, an indium tin oxide (ITO) anode layer; a hole transporting layer; an electron transporting layer; and a second electrode layer, for example, a low work function, electron-injecting, metal cathode layer of a magnesium-silver alloy, (Mg:Ag) or of a lithium-aluminum alloy, (Li:Al).

When the OLED is comprised of a double heterostructure having an additional layer of emissive material between the hole transporting and electron transporting layers, this additional layer may be referred to as a "separate emissive layer" so as to distinguish it from the electron transporting layer of a single heterostructure that functions both as the electron transporting layer as well as the emissive layer that produces the electroluminescence. The term "emissive layer" as used herein, thus, may refer either to the emissive, electron transporting layer of a single heterostructure or the separate emissive layer of a double heterostructure.

Although not limited to the thickness ranges recited herein, the substrate (element 1 in FIG. 1) may be as thin as 10$\mu$, if present as a flexible plastic or metal foil substrate, such as aluminum foil, or substantially thicker if present as a rigid, transparent or opaque, substrate or if the substrate is comprised of a silicon-based display driver; the ITO anode layer may be from about 500 Å (1 Å=$10^{-8}$ cm) to greater than about 4000 Å thick; the hole transporting layer from about 50 Å to greater than about 1000 Å thick; the separate emissive layer of a double heterostructure, if present, from about 50 Å to about 500 Å thick; the electron transporting layer from about 50 Å to about 1000 Å thick; and the metal cathode layer from about 50 Å to greater than about 100 Å thick, or substantially thicker if the cathode layer includes a protective silver layer and is opaque, that is, a device that is not a TOLED.

In one of the preferred embodiments of the present invention, the cathode is deposited as the bottom layer on the substrate onto which an IOLED heterostructure is deposited.

Thus, while there may be substantial variation in the type, number, thickness and order of the layers that are present, dependent on whether the device includes a single heterostructure or a double heterostructure, whether the device is a stacked OLED or a single OLED, whether the device is a TOLED or an IOLED, whether the OLED is intended to produce emission in a preferred spectral region, or whether still other design variations are used, the present invention is directed to those devices in which the OLED is comprised of an ITO-layer-containing heterostructure for producing electroluminescence in which the ITO layer is deposited initially at a relatively low ITO deposition rate so as to avoid causing damage to the organic layers onto which the ITO layer is either directly or indirectly deposited and the ITO layer is then deposited at a relatively high rate so as to reduce the time required to fabricate the OLEDs.

In particular, during the initial stages of the ITO deposition process, when substantial damage to the OLED surface may occur, the ITO deposition rate is preferably only about 2–5 Å/minute. However, after the growing ITO layer reaches a certain threshold thickness that is sufficient to protect the underlying layer or layers, the deposition rate may be increased several fold, preferably, to a deposition rate that is at least 5 to 10 times higher than the initial deposition rate.

For the RF power supply used to prepare the ITO layers according to the subject method, which was an Advanced Energy ATX-600 RF power supply, Fort Collins, Colo., the power settings may be varied from about 1W–7W for the low ITO deposition rates and from about 20W–40W for the higher ITO deposition rates. Thus, in going from the low ITO deposition rate up the higher ITO deposition rate, there may be an increase in the power settings of the RF power supply from as much as about a 3-fold increase up to about a 40-fold increase. Preferably, the increase is such as to produce an increase in the ITO deposition rate of at least from about a 5-fold increase up to about a 10-fold increase.

The underlying layer or layers may be a thin and relatively fragile Mg:Ag cathode layer, an organic layer that is under the Mg:Ag cathode layer, and/or an organic layer, such as a hole transporting layer, onto which the ITO layer is directly deposited, for example, whenever an IOLED is being fabricated. As described herein, a low ITO deposition rate is one for which no practically discernible damage to a fragile layer can be detected and a high ITO deposition rate is one for which discernible damage to a fragile layer can be detected.

A threshold thickness that is sufficient to protect the underlying layer or layers from damage during the ITO deposition process, herein referred to as a "protective ITO layer," is one for which no practically discernible difference is observed in the I–V characteristics for OLEDs prepared using the higher ITO deposition rates, as compared with OLEDs wherein the ITO layer is prepared using only the low, non-damaging, ITO deposition rates. No practically discernible difference in I–V characteristics is one for which, over the range of voltages applied across a particular OLED structure, the voltage required to obtain a particular current is within about 20% of the value that can be observed for that particular OLED structure whenever the ITO is deposited only at the low, non-damaging, ITO deposition rates.

While the threshold thickness of the growing layer of ITO that is required to protect the underlying layers may vary depending on the actual materials that are in the underlying layers, this threshold thickness is preferably about 50 to 200 Å, and more preferably about 50 to 100 Å, before substantially increasing the deposition rate. While the maximum rate that may be used without causing damage may also vary over a substantial range, also depending on the actual materials being coated, the deposition rate may be increased from about 2–5 Å/minute to at least about 50 to about 60 Å per minute. Programming the deposition process so as to gradually and continuously increase the ITO deposition rate throughout the process or, alternatively, to continuously increase the ITO deposition rate only after a certain threshold ITO thickness is reached also falls fully within the scope and spirit of the present invention. In such cases, whenever the ITO deposition rate is increased gradually and continuously, it is to be understood that the threshold thickness that is sufficient to function as the protective ITO layer may be somewhat thinner than that required whenever the ITO deposition rate is abruptly increased to a substantially higher ITO deposition rate.

The performance of the OLEDs prepared using the present invention may be evaluated by comparing the I–V characteristics of OLEDs made using the accelerated ITO deposition rate as compared with OLEDs prepared using a single ITO deposition rate throughout the ITO deposition process. It was discovered that OLEDs prepared using the present accelerated deposition rate method could be made with I–V characteristics having no practically discernible difference from the I–V characteristics of an OLED in which the deposition rate was kept at a low deposition rate throughout the ITO deposition process.

Figure 3:
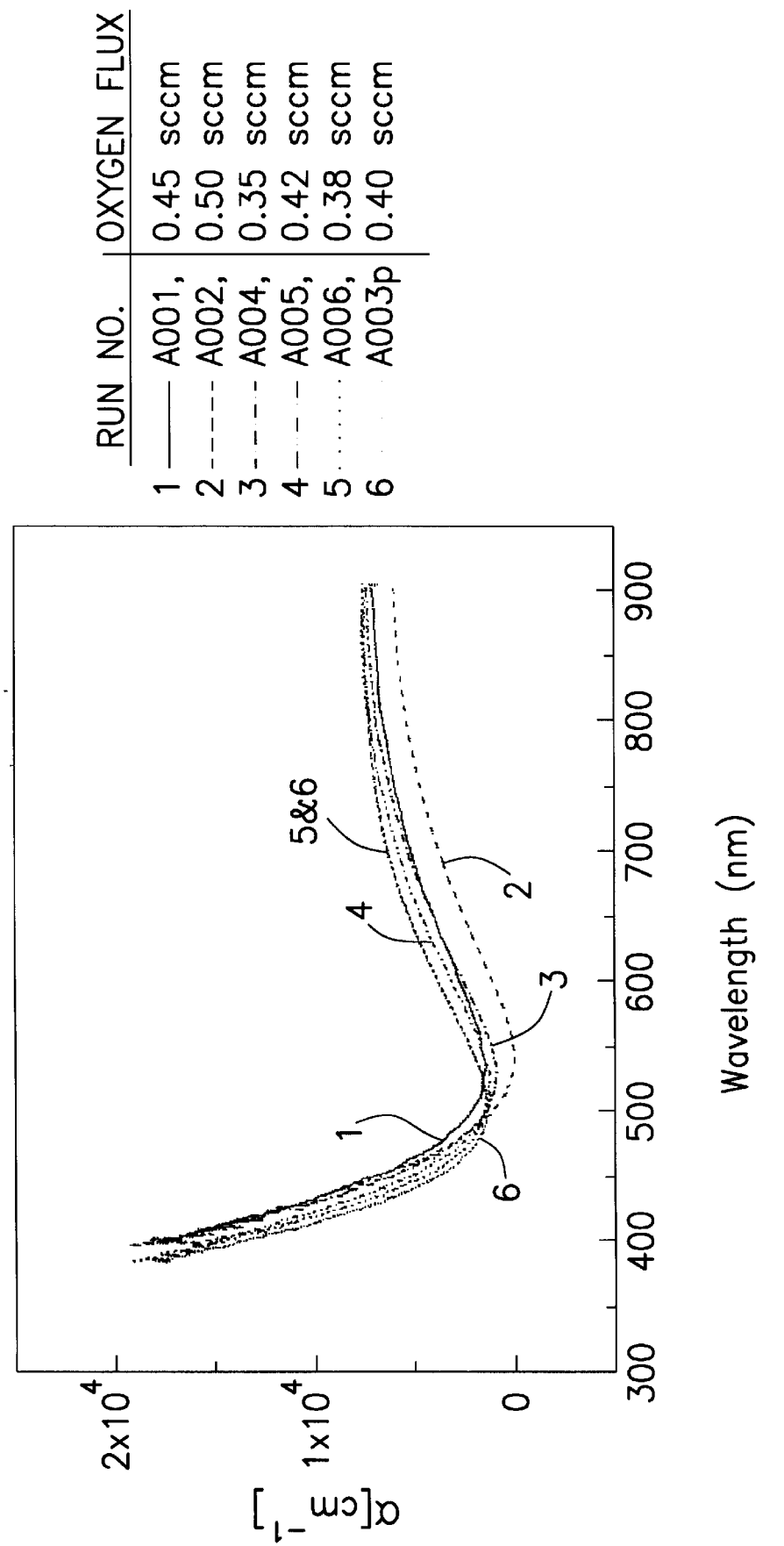
FIG. 3 shows how the absorption of 1000 Å thick ITO layers deposited at 45 W of RF power varies as a function of wavelength and as a function of $O_2$ flux (for an Ar flow of 200 sccm, a pressure of 5 mTorr, a rate of 0.8 Å/sec and onto a glass substrate).

In the preferred embodiments of the present invention, the ITO layer is sputtered using an RF power source onto the target in the presence of an oxygen flux that is selected to provide the desired combination of transparency and electrical resistivity values for a given ITO layer thickness. The actual oxygen flux that is selected may vary widely depending on the characteristics of the specific fabrication system used and may be evaluated in terms of the absorption of visible radiation by the ITO layer. In particular, it is preferable that the absorption of visible radiation, which varies as a function of wavelength over the visible region of the spectrum, be such as to produce a total light transmission, for the ITO layers made using the accelerated deposition rates as seen in FIG. 3 comparable to that for ITO coatings prepared at the lower ITO deposition rates.

Figure 2:
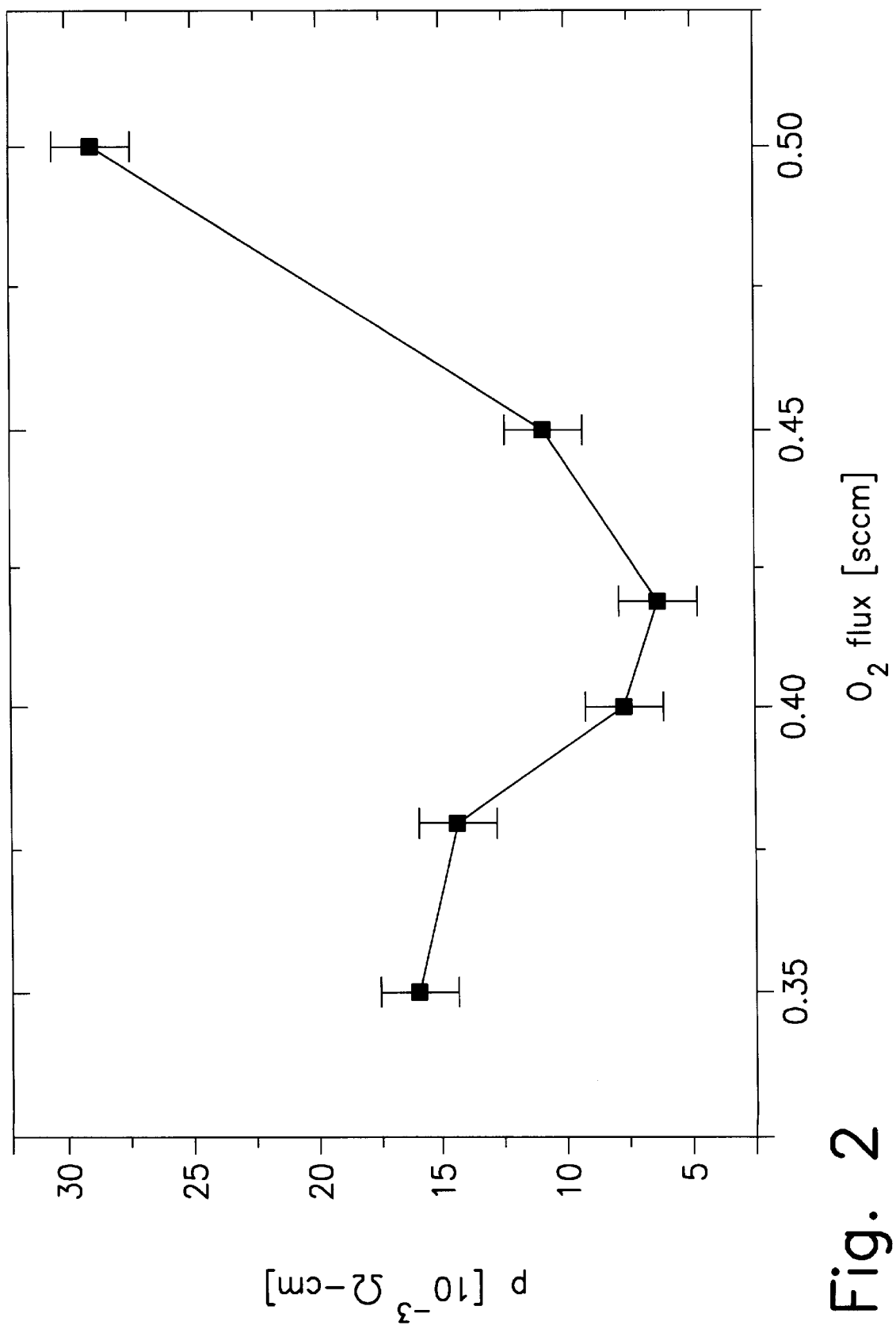
FIG. 2 shows how the resistivity of 1000 Å ITO layers deposited on glass with an Ar flow of 200 sccm and at a pressure of 5 mTorr and at 45 W of RF power varies as a function of the $O_2$ flux.

The oxygen flux may vary over the range from about 0.35 to about 0.50 sccm ("standard $cm^3$/minute") for the higher ITO deposition rates as seen in FIG. 2 and from none at all up to about 0.2 sccm, preferably, about 0.1 sccm, for the much lower ITO deposition rates. Using these criteria to evaluate the performance of the ITO layers prepared using the subject method, it has been found that an increase in the ITO deposition rate of at least ten-fold could be used to produce ITO coatings having I–V characteristics nearly identical to coatings prepared using only the lowest ITO deposition rates. Such an increase is typically produced by using a ten-fold increase in the RF power settings.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996); "Novel Materials for Multicolor Light Emitting Diodes", Ser. No. 08/850,264 (filed May 2, 1997); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (OLED's)", Ser. No. 08/774,087 (filed Dec. 23, 1996); "Driving Circuit For Stacked Organic Light Emitting Devices", Ser. No. 08/792,050 (filed Feb. 3, 1997); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997); "High Contrast Transparent Organic Light Emitting Device Display", Ser. No. 08/821,380 (filed Mar. 20, 1997); "Organic Light Emitting Devices Containing A Metal Complex of 5-Hydroxy-Quinoxaline as A Host Material", Ser. No. 08/838,099 (filed Apr. 15, 1997); "Light Emitting Devices Having High Brightness", Ser. No. 08/844,353 (filed Apr. 18, 1997); "Organic Semiconductor Laser", Ser. No. 08/859,468 (filed May 19, 1997); "Saturated Full Color Stacked Organic Light Emitting Devices", Ser. No. 08/858,994 (filed on May 20, 1997); "An Organic Light Emitting Device Containing a Hole Injection Enhancement Layer", Ser. No. 08/865,491 (filed May 29, 1997); "Plasma Treatment of Conductive Layers", PCT/US97/10252, (filed Jun. 12, 1997); "Patterning of Thin Films for the Fabrication of Organic Multicolor Displays", PCT/US97/10289, (filed Jun. 12, 1997); "OLEDs Containing Thermally Stable Asymmetric Charge Carrier Materials", Attorney Docket No. 10020/11 filed Sep. 8, 1997; "Light Emitting Device with Stack of OLEDS and Phosphor Downconverter", Attorney Docket No. 10020/31 (filed Sep. 9, 1997); and each co-pending application being incorporated herein by reference in its entirety. The subject invention may also be used in conjunction with the subject matter of each of co-pending U.S. patent application Ser. Nos. 08/354,674, 08/613,207, 08/632,322 and 08/693,359 and provisional patent application Ser. Nos. 60/010,013, 60/024,001, 60/025,501, 60/046,061 and 60/053,176, each of which is also incorporated herein by reference in its entirety.

The materials that may be used as the substrate, the hole-injecting anode layer, the hole transporting layer, the electron transporting layer, the electron-injecting, metal cathode layer, or the separate emissive layer, include the materials as disclosed in these co-pending applications.

The present method for depositing the ITO layer initially at a low deposition rate and then at a high deposition rate may be used in substantially any type of OLED containing an an ITO-layer-containing heterostructure for producing electroluminescence, for example, in OLEDs that are incorporated into a larger display, a vehicle, a computer, a television, a printer, a large area wall, theater or stadium screen, a billboard or a sign.

This invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

AN EXAMPLE OF THE INVENTION

In a representative example of the present invention, a commercially available glass substrate precoated with ITO, from Southwall Technologies, Inc., Palo Alto, Calif., was used. A hole transport layer comprised of about 300 Å of TPD was deposited onto the ITO anode layer, an electron transporting layer comprised of about 500 Å of tris-(8-hydroxyquinoline) aluminum($Alq_3$) was deposited onto the TPD hole transporting layer and a cathode layer of about 120 Å Mg—Ag was deposited onto the $Alq_3$ electron transporting layer.

An ITO layer according to the present invention was then prepared by depositing about 150 Å of ITO using only 5W of RF power in the presence of about 200 sccm Ar and 0.1 sccm $O_2$ onto the MG—Ag cathode layer and then an additional 400 Å of ITO was deposited using 45W RF power in the presence of about 200 sccm Ar and about 0.42 sccm $O_2$.

Figure 4:
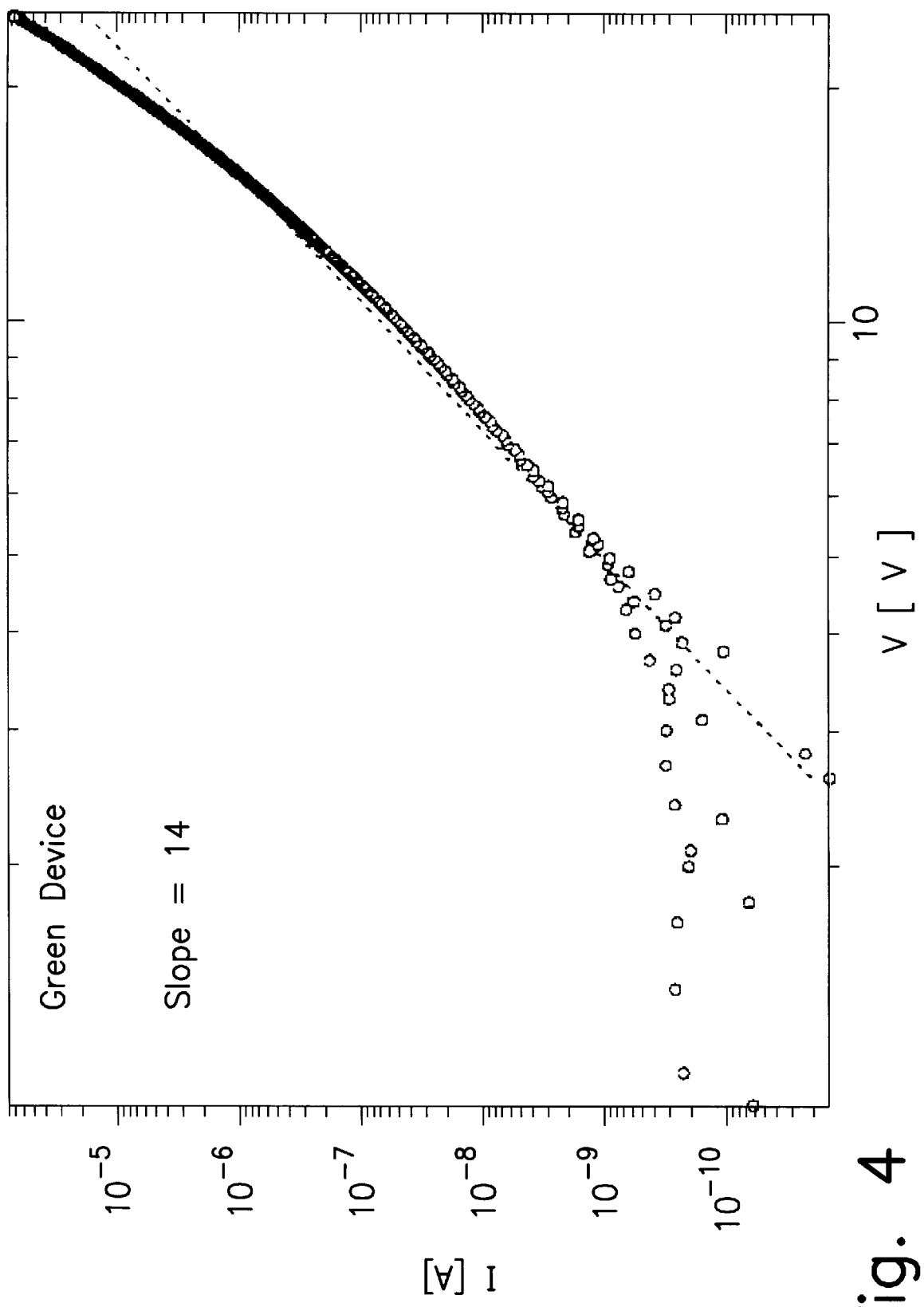
FIG. 4 shows how the I–V characteristic of a TOLED made using the higher ITO deposition rates (as shown by the small open circles) compares with the I–V characteristic of a TOLED for which the ITO layer was prepared entirely at the slower ITO deposition rate (dashed line).

FIG. 4 shows the current-voltage (I–V) characteristics of this heterostructure. There was no practically discernible difference between the I–V characteristics of this device as compared with an OLED having the entire ITO layer deposited at the slower deposition rate.

Although the particular OLED structure of FIG. 1 has been described, it is to be understood that any OLED structure having an ITO layer deposited using a low initial deposition rate and then a substantially higher deposition rate would be in accordance with this invention. Thus, those of skill in the art may recognize certain modifications to the various embodiments of the invention, such modifications are meant to be covered by the spirit and scope of the appended claims.

What is claimed is:

1. A method of fabricating an organic light emitting device comprising:
    fabricating a heterostructure for producing electroluminescence wherein the fabrication process includes the steps of:
    (a) depositing indium tin oxide at a low deposition rate of about 2–5 Å/min to form a protective indium tin oxide layer; and then
    (b) depositing indium tin oxide at a substantially higher deposition rate of at least about 50 Å/min.

2. The method according to claim 1 wherein the substantially higher indium tin oxide deposition rate is at least 5 times higher than the low indium tin oxide deposition rate.

3. The method according to claim 1 wherein the protective indium tin oxide layer is from about 50 Å to about 200 Å thick.

4. The method according to claim 1 wherein the heterostructure for producing electroluminescence is comprised of, in sequence, a substrate, an indium tin oxide anode layer, a hole transporting layer, an election transporting layer, a cathode layer and a second indium tin oxide layer, the second indium tin oxide layer being prepared according to steps (a) and (b).

5. The method according to claim 1 wherein the heterostructure for producing electroluminescence is comprised of, in sequence, a substrate, a cathode layer, an electron transporting layer, a hole transporting layer and an indium tin oxide layer, the indium tin oxide layer being prepared according to steps (a) and (b).

* * * * *

UNITED STATES PATENT AND TRADEMARK OFFICE
CERTIFICATE OF CORRECTION

PATENT NO. : 5,981,306  Page 1 of 2
DATED : November 9, 1999
INVENTOR(S) : Paul BURROWS, Stephen R. FORREST and Zilan SHEN It is certified that error appears in the above-identified patent and that said Letters Patent is hereby corrected as shown below:

Column 1, after the title, before line 5, please insert the following paragraph:

-- GOVERNMENT RIGHTS

This invention was made with Government support under Contract No. F33615-94-1-1414 awarded by DARPA. The government has certain rights in this invention.--

Column 5, line 6, change "...N-phenyl-amino|" to --...N-phenyl-amino]--;

Column 5, line 7, change "|N-(2-napthyl)..." to --[N-(2-napthyl)...--;

UNITED STATES PATENT AND TRADEMARK OFFICE
CERTIFICATE OF CORRECTION

PATENT NO. : 5,981,306
DATED : November 9, 1999
INVENTOR(S) : Paul BURROWS, Stephen R. FORREST and Zilan SHEN It is certified that error appears in the above-identified patent and that said Letters Patent is hereby corrected as shown below:

Column 5, line 7, change "...N-phenyl-amino|" to --...N-phenyl-amino]--;

Column 9, line 12, change "scam" to -- sccm --.

Signed and Sealed this

Twelfth Day of December, 2000

Attest:

Q. TODD DICKINSON

Attesting Officer    Director of Patents and Trademarks